United States Patent

Komaki et al.

[11] Patent Number: 5,268,201
[45] Date of Patent: Dec. 7, 1993

[54] COMPOSITE DIAMOND GRAIN AND METHOD FOR PRODUCTION THEREOF

[75] Inventors: Kunio Komaki; Takashi Fujimaki; Masaaki Yanagisawa, all of Tokyo; Yoichi Hirose, 358-225 Showa-machi Komejima, Kitakatsushika-gun, Saitama 344-01, all of Japan

[73] Assignees: Showa Denko Kabushiki Kaisha, Tokyo; Yoichi Hirose, Saitama, both of Japan

[21] Appl. No.: 698,923

[22] Filed: May 13, 1991

Related U.S. Application Data

[62] Division of Ser. No. 372,367, Jun. 20, 1989, Pat. No. 5,071,708.

[30] Foreign Application Priority Data

Oct. 20, 1987 [JP] Japan .................. 62-262727
Jul. 27, 1988 [JP] Japan .................. 63-187353
Sep. 1, 1988 [JP] Japan .................. 63-219889

[51] Int. Cl.$^5$ .................. C01B 31/06; C30B 25/00; C23C 16/22
[52] U.S. Cl. .................. 427/255.1; 427/215; 427/577; 427/590; 423/446; 423/458
[58] Field of Search .............. 428/403, 408, 368, 370, 428/607, 689; 501/86; 427/50, 52, 249, 255.1; 423/446, 458; 156/DIG. 68; 118/716, 724, 725

[56] References Cited

U.S. PATENT DOCUMENTS

| 3,714,334 | 1/1973 | Vickery | 423/446 |
| 4,707,384 | 11/1987 | Schachner et al. | 427/249 |
| 4,740,263 | 4/1988 | Imai et al. | 156/613 |
| 4,816,286 | 3/1989 | Hirose | 427/39 |
| 4,849,199 | 7/1989 | Pinneo | 423/446 |
| 4,859,493 | 8/1989 | Lemelson | 427/45.1 |
| 4,915,977 | 4/1990 | Okamoto et al. | 427/37 |
| 4,925,701 | 5/1990 | Jansen et al. | 427/38 |
| 4,938,940 | 7/1990 | Hirose et al. | 423/446 |

FOREIGN PATENT DOCUMENTS

60-177528 1/1986 Japan .

Primary Examiner—George F. Lesmes
Assistant Examiner—Christopher Brown
Attorney, Agent, or Firm—Oblon, Spivak, McClelland, Maier & Neustadt

[57] ABSTRACT

A composite diamond grain which comprises a heat-resistant grain as a nucleus and discrete diamond crystal particles distributed on the surface of the grain or diamond crystal films formed to cover the entire surface of the grain and a method for producing the composite diamond grain by the vapor-phase process are disclosed. For the filament method which is one form of the vapor-phase method, tantalum is useful as the material for the filament. Since tantalum is susceptible of embrittlement by hydrogen, a treatment to be performed on tantalum for the elimination of this drawback is also disclosed.

10 Claims, 3 Drawing Sheets

COMPOSITE DIAMOND GRAIN AND METHOD FOR PRODUCTION THEREOF

This is a division of application Ser. No. 07/372,367, filed on Jun. 20,1989, now U.S. Pat. No. 5,071,708.

TECHNICAL FIELD

This invention relates to a composite diamond grain composed of a heat-resistant grain and diamond crystals deposited on the surface of the grain and obtained by the vapor-phase method and to a method for the production thereof.

BACKGROUND ART

Heretofore, natural diamond, synthetic diamond grains produced from carbonaceous substances as raw material by the ultra-high pressure method and having their auto-morphic shape, grains obtained by grinding such diamond have been generally used as diamond grains for grinding and abrasion.

Recently, the vapor-phase method for synthesis of diamond has been developed. Various procedures for carrying out this method have been disclosed.

The inventors formerly filed PCT/JP 88/00299 relating to a composite diamond grain composed of a ceramic or metal grain having a diameter equal to or less than 30 $\mu$m as a nucleus and a vapor-phase method crystal diamond enclosing the grain therewith. The nucleus of the composite diamond grain involved in said application has a diameter of 30 $\mu$m at most and has conical projections and rectangular faces and square faces on the grain surface and, therefore, has restrictions on use. To expand the uses of the composite diamond grain, the inventors have continued a study in search for a method capable of producing a composite diamond possessing a nucleus no less than 30 $\mu$m in diameter and have accomplished the present invention.

DISCLOSURE OF INVENTION

This invention relates to a composite diamond grain composed of a heat-resistant grain and discrete diamond crystals deposited as dispersed on the surface of the grain or diamond crystal films deposited on the surface of the grain and to a method for the production thereof. This invention further relates to a method for the treatment of tantalum to be used for the hot filament vapor-phase method without any anxiety about the possibility of embrittlement by hydrogen.

BEST MODE FOR CARRYING OUT THE INVENTION

First, a composite diamond grain composed of a heat-resistant grain and discrete diamond crystal particles deposited as dispersed on the surface of the grain, and a method for the production thereof will be described.

As the material for the heat-resistant grain to be used in the composite diamond grain, diamond, such heat-resistant metallic and ceramic substances as W, Co, Ta, WC, SiC, TiC, $ZrO_2$, $Cr_2O_3$, TaN, ZrN, $Si_3N_4$, and etc. are useful. The size of the heat-resistant grain of such a substance is no less than 10 $\mu$m, preferably no less than 30 $\mu$m.

Though the upper limit of the size of the heat-resistant grain is not specifically defined, it is properly about 300 $\mu$m for the purpose of permitting uniform dispersion and deposition of discrete diamond crystals on the heat-resistant grain. The size of this grain is adjusted by such means as comminution or classification.

The diamonds deposited as dispersed on the surface of the heat-resistant grain are very minute, discrete diamond particles. The size of most of the minute particles is in the range of 0.1 to 100 $\mu$m.

The term "diamond crystals" as used in the present specification refers to all crystals including single crystals, aggregates of single crystals, and polycrystals.

Figure 1:
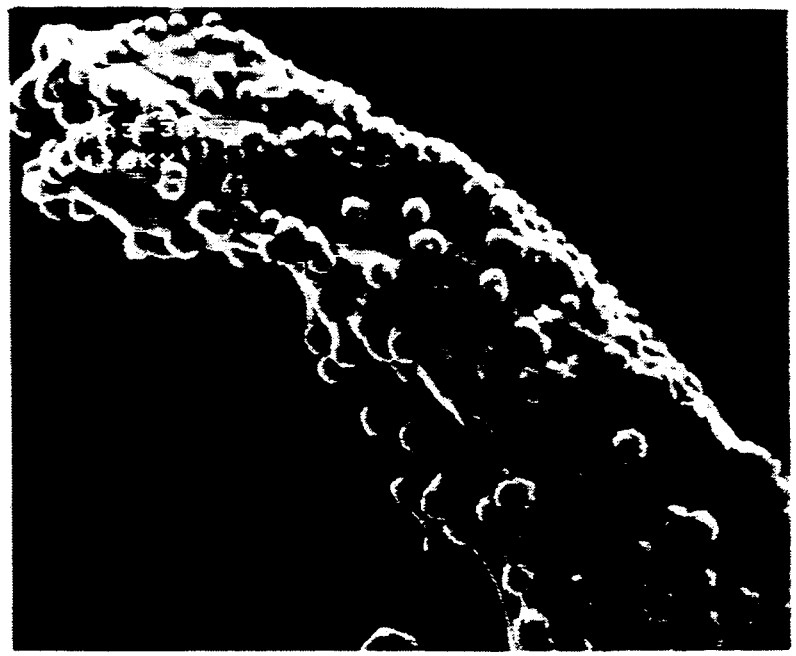
FIG. 1 is a scanning electron micrograph (SEM) illustrating at 1,000 magnifications a composite diamond grain of this invention produced in Example 1.
Figure 2:
FIG. 2 is an SEM illustrating at 5,000 magnifications the composite diamond grain mentioned above.

The "dispersed and deposited diamond crystals" mentioned above are spherical crystals whose auto-morphic surfaces partly exposed. FIG. 1 and FIG. 2 are SEM's of the composite diamond grain synthesized in Example 1 described below, respectively at 1,000 magnifications and 5,000 magnifications. In these micrographs, the very minute particles which are discrete diamond crystals deposited as dispersed on the surface of the heat-resistant grain are clearly shown. In FIG. 2 which shows the grain at about 5,000 magnifications, the edge lines of diamond auto-morphic crystals appear clearly. In the photograph, most of the minute diamond particles are present as separated clearly one from another but some of them are in contact with each other. Actually, there are times when these minute particles superpose in a multiplicity of layers. Since this composite diamond grain is produced by the vapor-phase method as described hereinbelow, the very minute diamond particles deposited on the surface of the heat-resistant grain are bound strongly to the surface of the grain.

For practical use, the discrete diamond crystal particles should cover about 10 to 90%, preferably about 30% to 80% of the surface of the heat-resistant grain.

The deposition of the diamond crystal particles on the surface of the heat-resistant grain can be attained by the well-known vapor-phase method of diamond synthesis. The gases as the raw material for this synthesis include hydrocarbons such as methane, ethane, propane, benzene, toluene, and cyclohexane and oxygen-containing organic compounds such as methanol, ethanol, propanol, tertiary butanol, and acetone, for example. These gases may be used in combination with oxygen-containing substances such as $H_2O$, $O_2$, $CO_2$, and CO. The gas or gases selected is/are used either alone or as mixed with one or more carrier gas such as hydrogen or argon. The pressure of the gas may range from about $10^{-2}$ Torr to a level suitably increased depending on the particular kind of the heating device to be used.

For the purpose of heating the gas to the temperature for the formation of diamond and decomposing the gas, there can be used any of the well-known means such as hot filament, microwaves, high frequency waves, direct-current arc discharge, electron beam, ultraviolet light, and infrared rays.

The deposition of the diamond particles on the entire surface of the heat-resistance grain can be accomplished for example by the flow method which comprises placing the heat-resistant grains on a base board and continuously or intermittently rolling them on the base board. Otherwise, the deposition of the diamond particles on the grain may be attained by placing the heat-resistant grains in a container, shaking the container vertically in the range for deposition of diamond thereby causing the particle grains to float inside the container. It is believed that the grains produced by comminution possess numerous active points which function like nuclei for the formation of diamond and that diamond particles are deposited on the active points as points of their origin. The amount of diamond particles to be deposited can be adjusted by the varying time of deposition. Desirably on a grain 30 to 300 $\mu$m in size, diamond particles are deposited in a total amount in the range of 10 to 180 parts by weight, based on 100 parts by weight of the grain.

For the discrete diamond crystals to be deposited as dispersed on the surface of the heat-resistant grain as described above, the filament temperature must be kept in the range of 1,600° C. to 2,250° C., preferably 2,000° C. to 2,200° C.

Now, a composite diamond grain composed of a heat-resistant grain and diamond crystal films deposited on the entire surface of the grain and a method for the production of the composite diamond grain will be described below.

The heat-resistant grain for the composite diamond grain is entirely the same in kind and size to that which is used for the aforementioned composite diamond grain having discrete diamond particles deposited as dispersed thereon. As the material for the heat-resistant grain, diamond, heat-resistant metallic substances such as W, Mo, Ta, WC, SiC, TiC, $ZrO_2$, $Cr_2O_3$, TaN, ZrN, and $Si_3N_4$, and ceramic substances are useful. Suitably, the size of this grain is no less than 10 $\mu$m, preferably no less than 30 $\mu$m.

The upper limit of the size of the heat-resistant grain is not specifically defined. For the purpose of enabling discrete diamond crystal films to be uniformly deposited on the grain, this upper limit is suitably about 500 $\mu$m. The adjustment of the grain size is accomplished by comminution or classification, for example.

Figure 3:
FIG. 3 is an SEM illustrating at 150 magnifications a composite diamond grain produced by the method of this invention and composed of a heat-resistant grain and diamond crystal films deposited on the entire surface of the grain.

The diamond crystal films deposited on the surface of the heat-resistant grain are composed mostly of very minute particles approximately in the range of 0.1 to 10 $\mu$m. These very minute particles piled up intimately to form films on the surface of the heat-resistant grain and cover the entire surface of the grain. FIG. 3 is an SEM illustrating the films at 150 magnifications. FIG. 3 clearly shows that these films are formed of aggregates of numerous very minute particles.

Now, a method for the production of a composite diamond grain composed of a heat-resistant grain and diamond crystal films deposited on the entire surface of the aforementioned heat-resistant grain will be described.

This production is also effected by the vapor-phase method. By specifying the various conditions of the vapor-phase method, the composite diamond grain possessed of diamond crystal films aimed at can be produced. Now, the production by the hot filament method will be described below. The diamond crystal films to be deposited by this method are affected by various factors such as, for example, the temperature of the filament, the material of the filament, and the activity of the heat-resistant grains, particularly significantly by the temperature of the filament and the material of the filament.

The inventors have succeeded in uniformly and densely forming diamond membranes by using a tantalum filament, keeping the temperature of the filament at or above 2,250° C., and keeping the heat-resistant grains in a fluid state. Owing to the use of a high exciting energy, even on heat-resistant grains of a large size equal to or exceeding 30 $\mu$m in the portion of the surface thereof having active points in a relatively low density, the formation of diamond nuclei, which has never been attained by the conventional method, can be realized by the method of this invention. Thus, the produced composite diamond grains have the entire surface thereof covered with diamond crystal films.

When the diamond particles are deposited on the entire surface of the heat-resistant grain by the vapor-phase method of diamond synthesis, they are bound strongly to the grain.

The size of the particles forming the diamond films can be selected in the range of from the order of submicrons to the about 20 $\mu$m, depending on the conditions of deposition.

When these diamond particles are deposited densely, they are allowed to form crystal films.

The production of the composite diamond grain possessed of the diamond crystal films is attained by the conventional vapor-phase method except for the conditions specifically mentioned above.

We will now describe a tantalum filament for the hot filament method.

As the material for the hot filament method, generally such heat-resistant metals as tungsten, tantalum, and molybdenum are used.

Particularly, among all metals in practical use, tantalum has an advantage in that it possesses highly satisfactory, workability, exhibits a high melting point second only to tungsten, and forms a carbide of a high melting point.

Tantalum, however, is susceptible to embrittlement by hydrogen and, therefore, has inferior durability when the raw material gas contains hydrogen. In the method of diamond synthesis using a hot filament; as exciting means, a hydrocarbon, an alcohol, or acetone as the raw material is used as mixed with hydrogen gas. If tantalum is used as the material for the filament, the filament is liable to undergo embrittlement by hydrogen before it is allowed to form a carbide which is stable against hydrogen. When the tantalum filament is used for the synthesis, therefore, this synthesis is not always obtained with satisfactory productivity.

The inventors have made a study for the purpose of eliminating the drawbacks inherent in tantalum as described above and found that these drawbacks are overcome by heating tantalum in an inert gas containing a carbon compound gas.

This treatment to be performed on tantalum is described further in detail below.

First, a piece of tantalum formed in the shape of a filament is heated in an inert gas. For the purpose of carbonizing the tantalum filament, the inert gas is required to contain a carbon compound gas.

The term "inert gas" as used herein means a rare gas such as argon or helium or a gas such as nitrogen gas which is relatively inactive to tantalum.

The heating may be effected directly by passage of electricity or indirectly by application of external heat. This heat treatment eliminates the strain in metallic texture which is one of the causes for the embrittlement of tantalum by hydrogen and makes the tantalum filament resistant to embrittlement and susceptible to carbonization. The temperature of this heat treatment is required to equal or exceed 600° C. and is desired to be no less than 1,600° C. and no more than 2,800° C. Though the composition of the atmosphere in which the heat treatment is to be carried out is variable with the shape and temperature of the filament, the concentration of the inert gas must be no less than 20% and that of the carbon compound gas at least 0.1% (by volume) in terms of methane.

The duration of the heat treatment must be at least 5 minutes.

As the carbon compound gas for the carbonization of the tantalum filament, the raw material gas to be used in the conventional vapor-phase method of diamond synthesis can be used in its unmodified form. The carbon compound gases usable for this purpose include hydrocarbons, alcohols, and acetone, for example. This hydrocarbon compound gas may incorpote therein some hydrogen gas.

The heat treatment of the tantalum filament may be carried out with the ambient gas displaced so as to ensure smooth continuity from the heat treatment to the process of diamond synthesis to be subsequently carried out. This continuity may be attained, for example, by first filling the reaction vessel with an inert gas, introducing the carbon compound gas and hydrogen gas piecemeal into the reaction vessel, converting the ambient gas into the gas for synthesis of diamond and thereby completing the heat treatment of the tantalum filament and starting the synthesis of diamond in the presence of the tantalum filament endowed with high durability. In this case, the speed of the displacement is variable with the shape and temperature of the filament. The time required in displacing 50% of the inert gas inside the reaction vessel is desired to be no less than 5 minutes.

Owing to the introduction of the raw material gas in the manner described above, a film of tantalum carbide is formed on the surface of the tantalum filament to prevent the tantalum filament from embrittlement by hydrogen. As the heating of the tantalum filament in the raw material gas is continued, the film of tantalum carbide gains proportionately in thickness.

Figure 4:
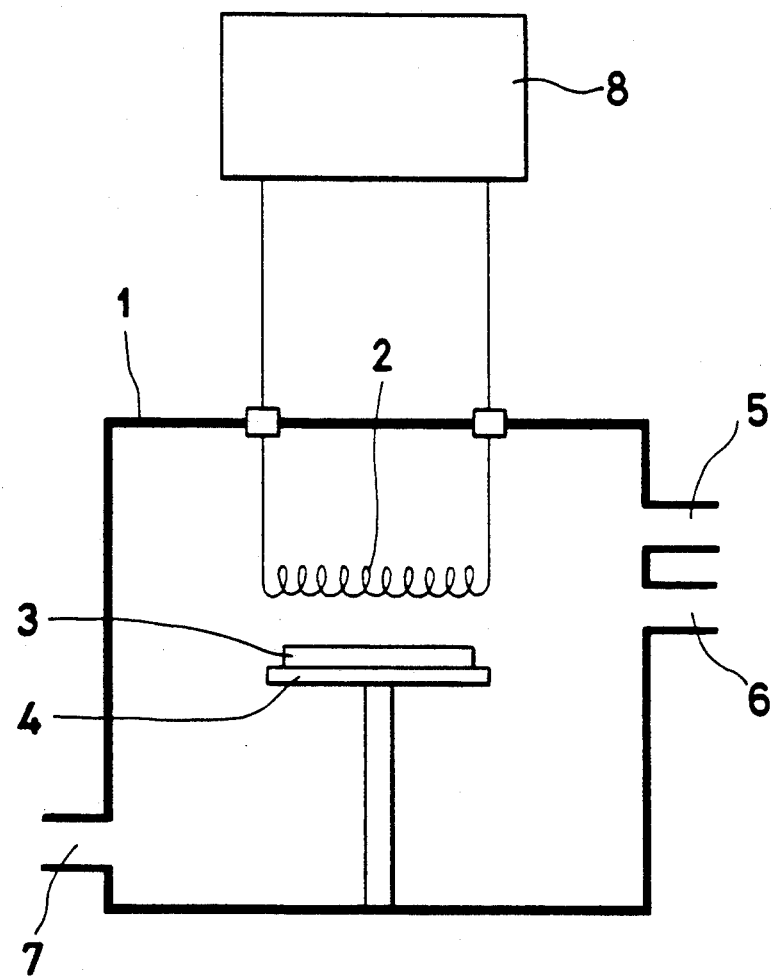
FIG. 4 is a diagram illustrating an apparatus for the synthesis of diamond by the vapor-phase method and concurrently for the treatment of preventing a tantalum filament from embrittlement by hydrogen.

Now, an apparatus for carrying out this heat treatment of the tantalum filament will be described below with reference to FIG. 4 which illustrates one examples of the apparatus.

In the diagram, 1 stands for a reaction tank made of metal, for example. Inside this reaction tank are disposed an exciting tantalum filament 2, a substrate 3 for deposition, and a supporting base 4 for the substrate 3. The apparatus is further provided with an inert gas inlet 5, a raw material gas inlet 6, a gas outlet 7, and a power source 8 for heating the filament with electric current.

The apparatus thus constructed concurrently serves as means for carbonizing the surface of the tantalum filament and as means for effecting vapor-phase synthesis of diamond. If the substrate for deposition is placed before the inert gas is displaced thoroughly with the raw material gas, there arises a possibility that non-diamond carbon will be deposited. The substrate for deposition, therefore, is desired to be inserted in the reaction tank at the time the displacement of gases is completed.

By this invention, a composite diamond grain having discrete diamond crystal particles deposited as dispersed on the surface of a heat-resistant grain as a nucleus or a composite diamond grain having diamond crystal films formed to cover the entire surface of the heat-resistant grain can be easily produced by suitably varying the reaction conditions. Further, the tantalum filament which has heretofore suffered from deficiency in practical utility because of insufficient service life due to the embrittlement by hydrogen is freed from the problem of embrittlement by hydrogen and enabled to assume a state of high excitation energy exceeding 2,250° C. Thus there is obtained a notable improvement in the practical utility of tantalum products.

Now, the present invention will be described below with reference to working examples and a comparative experiment.

EXAMPLE 1

On a graphite plate provided with a built-in heater, about 50 mg of $\alpha$-SiC grains (about 120 $\mu$m in size) as heat-resistant grains were distributed uniformly in an area of 20 mm $\times$ 20 mm. The graphite plate was set in a reaction device (about 2 liters) of the hot filament type. Above the graphite plate, a coiled tungsten filament 0.3 mm in diameter (15 mm in length) was set at a distance of 5 mm from the plate. Trial synthesis was repeated by feeding an acetone-hydrogen mixture having an acetone concentration of 1.5% volume at a total flow volume of 120 cc/min and stirring the SiC grains at intervals of 30 minutes, with the reaction pressure at 500 Torrs, the filament temperature at 2,200° C., and the temperature (of the surface of the supporting base of the plate) at 850° C. The synthesis was conducted for a total period of 5 hours. With the aid of an optical microscope and an SEM, the synthesis was confirmed to have produced composite diamond grains each composed of a 120-$\mu$ SiC grain and angular diamond particles (about 15$\mu$ in diameter) scattered on the SiC grain. FIG. 1 is an SEM illustrating such a composite diamond grain at 1,000 magnifications and FIG. 2 is an SEM at 5,000 magnifications.

The composite diamond grains formed in consequence of the reaction had a weight of about 72.3 mg.

EXAMPLE 2

An $\alpha$-SiC ingot produced by the reduction of $SiO_2$ with carbon was comminuted with a ball mil. The resultant powder was classified to obtain grains of an average diameter of 500 $\mu$m. In a reaction bucket disposed inside a hot filament type apparatus for diamond synthesis, 300 mg of the grains were set. As an excitation hot filament, a coiled tantalum wire 0.3 mm in diameter heat-treated in advance at 2,000° C. under argon and ethanol gas was set at a height of 7 mm from the inner bottom surface of the reaction bucket. The bucket was electromagnetically vibrated to cause the SiC grains rise to a height of about 2 mm in the space inside the bucket.

The reaction for synthesis was carried out for 10 hours, with the pressure at 200 Torrs, the tantalum filament temperature at 2,450° C., the ethanol concentration of the ethanol-hydrogen mixture as the raw material gas at 3% by volume, and the total flow volume at 150 cc/min.

After the completion of the reaction, the grains were taken out of the bucket and examined with respect to surface condition under an optical microscope. The grains were composed of a starting SiC grain and a thick coating of diamond particles and were closely similar in shape to the starting grains. The coating layer assumed the form of compact films each composed of particles several microns in size. When the grain surface was tested for Raman shift by microscopic Raman spectrometry, a sharp peak due to diamond bond was recognized at 1,334 cm$^{-1}$ and a very broad and low peak near 1,500 cm$^{-1}$. The results indicate that the diamond coating films comprises a diamond phase and a trace of i-carbon component. The weight of the composite diamond grains was about 652 mg.

EXAMPLE 3

A coiled tantalum wire 0.3 mm in diameter and 60 mm in length was set in a reaction tank of quartz measuring 70 mm in diameter and 1,000 mm in length.

The reaction tank was charged with argon gas and the tantalum filament was heated by supply of electric current under a pressure of 90 Torrs. The temperature of this heating was 2,000° C.

After this heating was continued for 5 minutes under these conditions, gaseous ethanol was fed at a flow volume of 3 cc/min and hydrogen gas at 100 cc/min into the reaction tank and the pressure was kept at 90 Torrs. On elapse of 15 minutes after the start of gas displacement, the temperature of the filament was elevated at a temperature increasing rate of about 50° C./min up to 2,400° C. to complete the heat treatment for carbonization of the filament.

Then, trial synthesis of diamond was carried out by using this filament and placing at a position 10 mm below the filament a Si substrate having the surface thereof ground in advance with a diamond paste containing diamond particles 1 μm in diameter. As the raw material, gaseous ethanol fed at 3 cc/min and hydrogen gas fed at 100 cc/min were used as mixed with each other. The reaction pressure was 90 Torrs and the filament temperature was 2,400° C. Under these conditions, the synthesis was continued for 100 hours. As a result, diamond films 850 μm in thickness were formed on the Si substrate without entailing any noticeable deterioration of the filament.

COMPARATIVE EXPERIMENT

In the same reaction apparatus as used in Example 3, trial synthesis of diamond was immediately started without introducing any argon gas into the reaction tank or subjecting the tantalum filament to the heat treatment. The conditions for the synthesis were the same as those of Example 1; the feed rate of ethanol at 3 cc/min and that of hydrogen gas at 100 cc/min and the reaction pressure at 90 Torrs. When the temperature of the filament was elevated to 2,400° C., the filament broke after about 15 minutes of this heating.

We claim:

1. A method for the production of a composite diamond grain, comprising the steps of:
   setting in a reaction vessel for synthesis of diamond a tantalum filament;
   introducing an inert gas into the reaction vessel to induce an atmosphere containing the inert gas;
   introducing a carbon compound gas and hydrogen gas into the atmosphere so that the insert gas has a concentration of at least 20% by volume and the carbon compound gas has a concentration of at least 0.01% by volume in terms of methane while heating the tantalum filament to a temperature in the range of 1600° C. to 2800° C. to deprive the tantalum filament of strain and make the tantalum filament resistant to embrittlement and susceptible to carbonization;
   setting in the reaction vessel a container containing therein a heat-resistant grain for crystallization of diamond;
   introducing a gaseous raw material for formation of diamond into the resultant atmosphere while adjusting the temperature of the tantalum filament, thereby exciting the atmosphere to a diamond-forming atmosphere; and
   fluidizing the heat-resistant grain to deposit diamond crystals on the surface of the heat-resistant grain.

2. The method according to claim 1, wherein said heat-resistant grain has a diameter of at least 30 μm.

3. The method according to claim 1, wherein the temperature of said tantalum filament for exciting the inert-gas atmosphere in the reaction vessel to the diamond-forming atmosphere is in the range of 1600° C. to below 2250° C. and the diamond crystals deposited on the surface of the heat-resistant grain are discrete crystals.

4. The method according to claim 3, wherein said discrete crystals occupy 10 to 90% of the surface of said heat-resistant grain.

5. The method according to claim 1, wherein the temperature of said tantalum filament for exciting the inert-gas atmosphere in the reaction vessel to the diamond-forming atmosphere is not less than 2250° C. and the diamond crystals deposited on the surface of the heat-resistant grain are compact crystal films covering the entire surface of said heat-resistant grain.

6. A method for the production of a composite diamond grain, comprising the steps of:
   setting in a reaction vessel for synthesis of diamond a tantalum filament and a container containing therein a heat-resistant grain for crystallization of diamond so that the heat-resistant grain can be fluidized;
   introducing an inert gas into the reaction vessel to induce an atmosphere containing the inert gas;
   introducing a carbon compound gas and hydrogen gas into the atmosphere so that the inert gas has a concentration of at least 20% by volume and the carbon compound gas has a concentration of at least 0.01% by volume in terms of methane while heating the tantalum filament to a temperature in the range of 1600° C. to 2800° C. to deprive the tantalum filament of strain and make the tantalum filament resistant to embrittlement and susceptible to carbonization;
   introducing a gaseous raw material for formation of diamond into the resultant atmosphere while adjusting the temperature of the tantalum filament, thereby exciting the atmosphere to a diamond-forming atmosphere; and
   fluidizing the heat-resistant grain to deposit diamond crystals on the surface of the heat-resistant grain.

7. The method according to claim 6, wherein said heat-resistant grain has a diameter of at least 30 μm.

8. The method according to claim 6, wherein the temperature of said tantalum filament for exciting the inert-gas atmosphere in the reaction vessel to the diamond-forming atmosphere is in the range of 1600° C. to below 2250° C. and the diamond crystals deposited on the surface of the heat-resistant grain are discrete crystals.

9. The method according to claim 8, wherein said discrete crystals occupy 10 to 90% of the surface of said heat-resistant grain.

10. The method according to claim 6, wherein the temperature of said tantalum filament for exciting the inert-gas atmosphere in the reaction vessel to the diamond-forming atmosphere is not less than 2250° C. and the diamond crystals deposited on the surface of the heat-resistant grain are compact crystal films covering the entire surface of said heat-resistant grain.

* * * * *